United States Patent [19]

Landgraf et al.

[11] Patent Number: 4,823,077

[45] Date of Patent: Apr. 18, 1989

[54] CHANNEL-GAIN-VERNIER-TRACKING TRIGGER HYSTERESIS FOR AN OSCILLOSCOPE

[75] Inventors: Robert M. Landgraf, Woodland Park; Johnie L. Hancock, Colorado Springs, both of Colo.

[73] Assignee: Hewlett-Packard Company, Palo Alto, Calif.

[21] Appl. No.: 271,369

[22] Filed: Nov. 14, 1988

Related U.S. Application Data

[63] Continuation of Ser. No. 928,936, Nov. 10, 1986, abandoned.

[51] Int. Cl.$^4$ .................... G01R 13/20; G01R 15/08
[52] U.S. Cl. ................... 324/121 R; 324/77 A; 364/487
[58] Field of Search .................... 324/121 R, 77 A; 364/487; 340/722, 709, 750, 799, 347 SH

[56] References Cited

U.S. PATENT DOCUMENTS

| | | | |
|---|---|---|---|
| 4,134,149 | 1/1979 | Nord | 340/750 X |
| 4,225,940 | 9/1980 | Moriyasu et al. | 324/121 R X |
| 4,346,333 | 8/1982 | Dagostino | 324/121 R X |
| 4,510,571 | 4/1985 | Dagojtino et al. | 364/487 X |
| 4,647,915 | 3/1987 | Shank et al. | 340/722 X |
| 4,749,907 | 6/1988 | Boatwright et al. | 324/121 R X |

*Primary Examiner*—Reinhard J. Eisenzopf
*Assistant Examiner*—Vinh P. Nguyen
*Attorney, Agent, or Firm*—Christopher J. Byrne

[57] ABSTRACT

Disclosed is a circuit for maintaining a constant effective hysteresis at the input to a trigger comparator of an oscilloscope for the purpose of preventing double triggering due to false triggers. A microprocessor tracks the trigger amplifier gain control inversely relative to the vertical vernier amplifier gain control via digital-to-analog converters at the input to each gain control. Such tracking serves to adjust the trigger signal inversely relative to the on-screen signal such that a constant hystersis is maintained.

1 Claim, 3 Drawing Sheets

CHANNEL-GAIN-VERNIER-TRACKING TRIGGER HYSTERESIS FOR AN OSCILLOSCOPE

CROSS REFERENCE TO RELATED APPLICATION

This application is a continuation of application Ser. No. 928,936, filed Nov. 10, 1986, now abandoned.

BACKGROUND OF THE INVENTION

An oscilloscope is used to acquire, analyze and display electronic signal waveforms. The oscilloscope takes electronic signals and plots their waveforms on a cathode ray tube (CRT) display screen in units of voltage-versus-time. Conventionally, voltage amplitude is plotted along the vertical, that is, the Y axis and time is plotted along the horizontal, that is, the X axis. In the past decade, digital oscilloscopes have been developed. The basic scheme in digital oscilloscope operation is the sampling of a signal followed by analog-to-digital conversion of the voltage values of the acquired samples. The digitized information is then placed in memory and used to create the display of the signal's waveform.

A trigger level is a voltage value which the input signal must exceed before the oscilloscope begins tracking the signal with samples. The oscilloscope is said to be triggered when this level is achieved. Double triggering is an error caused by a so-called false trigger. A false trigger is noise on the input signal which may appear as a trigger voltage level to the triggering circuitry of the oscilloscope. Double triggering can result in the appearance of two superimposed and out-of-phase versions of the same signal on the oscilloscope display screen. To reduce the likelihood of double triggering, hysteresis is introduced into the trigger circuit of the oscilloscope. Fundamentally, hysteresis is just the difference between two voltage levels. The hysteresis defines a first voltage level, known as the arm point, and a second higher voltage level, known as the fire point. Ideally, the input signal must first exceed the arm point and then the fire point, in sequence, in order for the trigger circuit to detect a true trigger. For instance, the arm point can enable a trigger comparator and the fire point can cause an output from the trigger comparator, signalling a true trigger. Generally, the hysteresis is set such that typical signal noise and internal instrument noise will not cause a false trigger. The size of the hysteresis determines the minimum signal necessary to produce a triggered waveform on the oscilloscope display screen.

FIG. 1 shows an input signal having an arm point and a fire point defining the triggering hysteresis, where the hysteresis is the fire point value minus the arm point value. FIG. 2 shows an input signal having a false trigger due to noise on the signal. FIG. 3 shows an example of the double trigger display which is due to a false trigger.

FIG. 4 shows a typical oscilloscope circuit wherein input signal 50 is buffered by buffer amplifier 110 and then sent to both a vertical gain vernier circuit 75 and trigger circuit 100. Vertical gain circuit 75 comprises a vertical amplifier 120 which controls the gain vernier along the vertical axis, that is, the voltage amplitude axis, of the oscilloscope display screen. Vertical amplifier 120 has a user-adjustable vertical gain vernier control 125, typically having a range of 1 through 2.5. Trigger circuit 100 comprises a trigger amplifier 130 and a trigger comparator 140. One input to trigger comparator 140 is the output of trigger amplifier 130. The other input to trigger comparator 140 is a user-adjustable trigger level input having trigger level offset control 145. Ideally, the trigger level input defines the voltage level at which the oscilloscope will trigger. Trigger comparator 140 will produce an output given a predetermined difference between its inputs. Ideally, the output of trigger comparator 140 indicates a true trigger.

Typically, trigger comparator 140 has a fixed hysteresis. Typically, trigger amplifier 130 has a gain control 135. Varying the gain of trigger amplifier 130 varies the input to trigger comparator 140 and consequently the effective hysteresis is varied. For instance, with a fixed hysteresis on trigger comparator 140, a doubling of the output of trigger amp 130 will halve the hysteresis and a halving of the output of trigger amplifier 130 will double the hysteresis. This variation in the effective hysteresis can be seen in FIGS. 5A and 5B. In FIG. 5A, input signal 25A has a noise spike on its down slope but the size of the hysteresis prevents a false trigger. In FIG. 5B, input signal 25B has twice the gain of input signal 25A of FIG. 5A. Although the hysteresis is the same in both FIGS. 5A and 5B, doubling the gain of signal 25A to produce signal 25B also doubles the size of the noise spike which then is big enough to cause a false trigger. Therefore, doubling the signal effectively halves the hysteresis and halving the signal would likewise effectively double the hysteresis.

To prevent the problem of variation in the effective size of the hysteresis, the gain control 135 of trigger amplifier 130 is typically fixed when the instrument is calibrated. However, fixing the trigger amplifier gain has negative side-effects. To keep a signal spanned across a constant number of divisions on the display screen as the vertical gain 125 is adjusted from X1 to X2.5, the input to trigger amplifier 130 would also have to vary from X1 to X2.5, causing the hysteresis to vary inversely, requiring trigger level control 145 to have sufficient range to cover the largest signal at the lowest vertical gain setting as well as sufficient resolution to cover the smallest signal at the largest vertical gain setting. The slew rate demands through the trigger circuit path would also be X2.5 higher than if the signal range was fixed.

SUMMARY OF THE INVENTION

The present invention provides for an effective constant hysteresis through a micro-processor controlled tracking of the trigger amplifier gain control and the vertical amplifier gain control. A micro-processor controls the tracking of the two gain controls via digital-to-analog converters (DAC) which are connected to the input of each gain control. The tracking of the two gain controls allows for an effectively constant voltage range, that is, hysteresis, to the trigger comparator relative to the on-screen vertical range of the signal. Hence, a four-division signal on screen at a vertical gain setting of X1 will give the same input to the trigger comparator as a four-division signal at X2.5 vertical gain. Such tracking provides several benefits. Throughout the range of vertical gain, noise rejection will be constant; the effective hysteresis will remain constant; the minimum signal required for triggering will remain constant; the require trigger level resolution will remain constant; and the slew rate demands of the trigger circuit will be reduced.

DESCRIPTION OF THE PREFERRED EMBODIMENT

Figure 1:
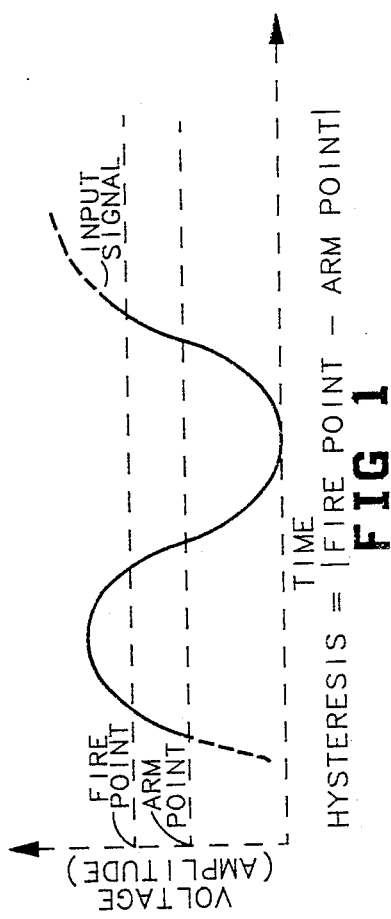
FIG. 1 shows an input signal having an arm point and a fire point defining trigger hysteresis.
Figure 2:
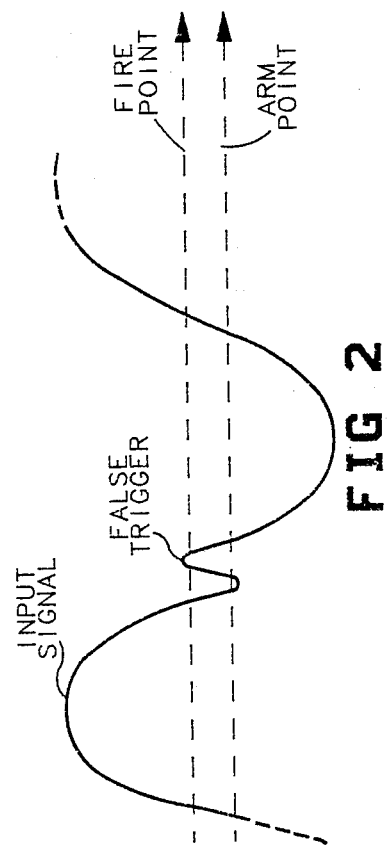
FIG. 2 shows an input signal having a false trigger.
Figure 3:
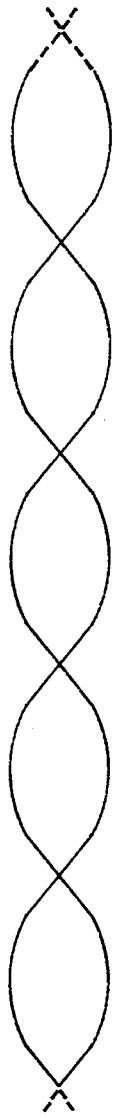
FIG. 3 shows an example of double trigger due to a false trigger.
Figure 4:
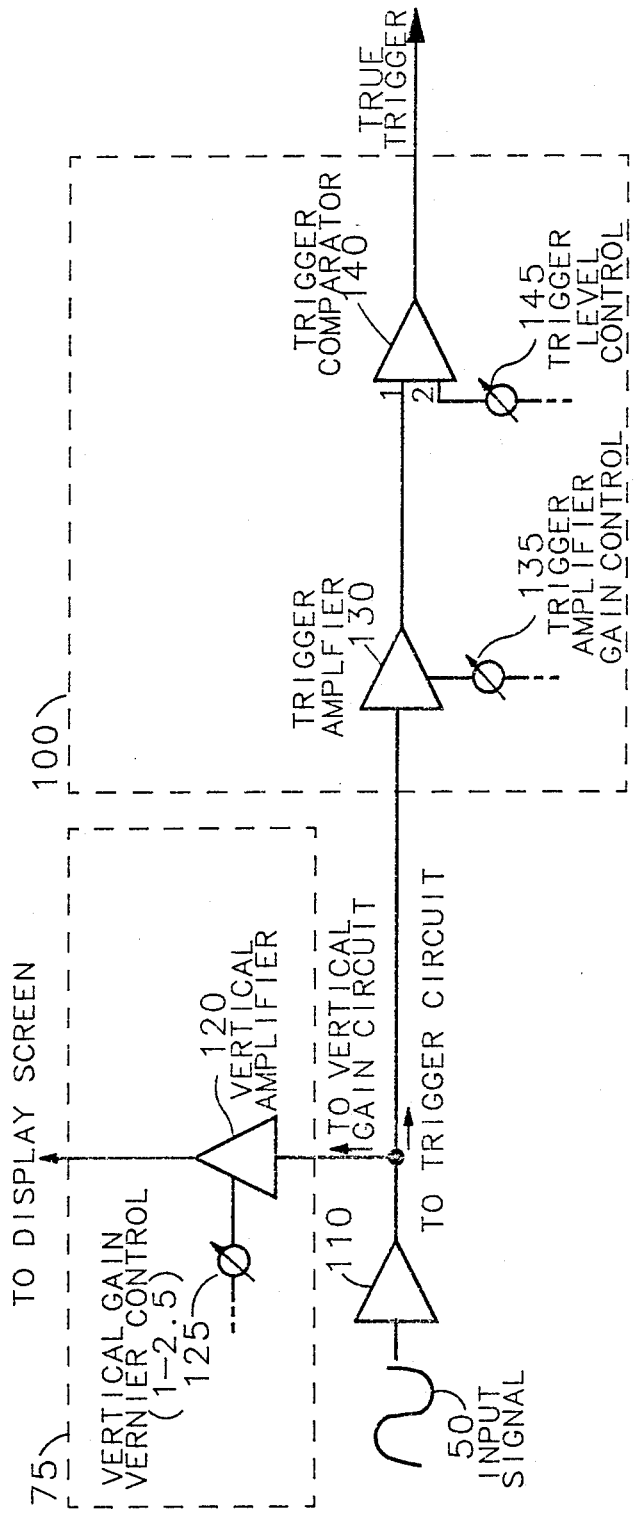
FIG. 4 shows a typical oscilloscope circuit having an input signal buffer, a vertical gain vernier circuit and a trigger circuit.
Figure 5A:
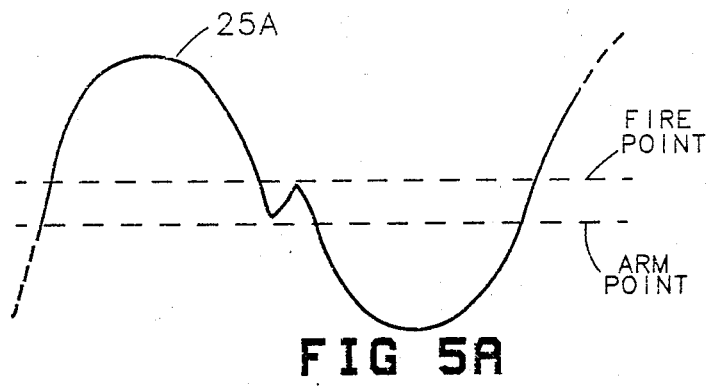
FIGS. 5A and 5B show variation in the effective hysteresis due to gain changes in a signal
Figure 5B:
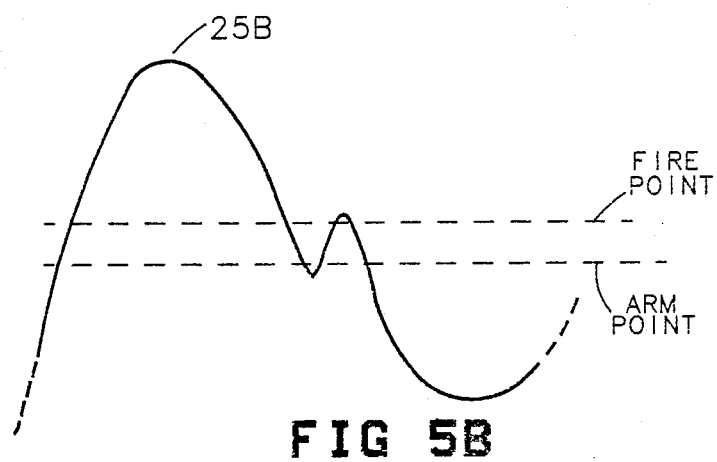
Figure 6:
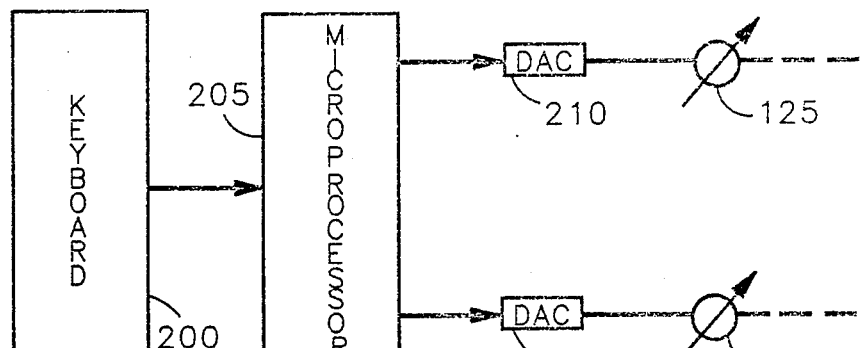
FIG. 6 shows a circuit for tracking the trigger amplifier gain control of FIG. 4 to the vertical amplifier gain control of FIG. 4 via a microprocessor.

FIG. 6 shows a circuit for tracking the trigger amplifier gain control 135 to the vertical amplifier gain control 125. The oscilloscope user can enter vertical gain control commands at keyboard 200. Microprocessor 205 then issues predetermined signals to vertical gain control 125 via digital-to-analog convertor (DAC) 210 and to trigger gain control 135 via DAC 220. The tracking by microprocessor 205 serves to inversely adjust trigger amplifier gain control 135 relative to vertical gain control 125 such that the effective hysteresis seen by trigger comparator 140 remains constant.

We claim:

1. A digital oscilloscope having a microprocessor and also having a display screen for displaying input signal waveforms, said oscilloscope comprising:

a trigger means for triggering the capture and display of said input signal, said trigger means having an adjustable trigger gain control;

a user-adjustable vertical gain vernier means for adjusting the vertical gain of said signal on said display screen, said vertical gain vernier means having a user-adjustable vertical gain control;

a plurality of digital-to-analog convertors, wherein a first digital-to-analog convertor is configured to interface between said microprocessor and said trigger gain control and a second digital-to-analog convertor is configured to interface between said microprocessor and said vertical gain control; and wherein said microprocessor is configured to control the inputs of said first and second digital-to-analog convertors such that said vertical gain control is inversely tracked to said trigger gain control such that said oscilloscope has a constant effective trigger hysteresis, and such that the minimum amplitude of the signal required for triggering said oscilloscope remains constant, and such that the required trigger level resolution of said oscilloscope remains constant, and such that the slew rate demands of the trigger circuit of said oscilloscope remains constant, and such that throughout the range of vertical gain of said oscilloscope the input signal-noise rejection capability of said oscilloscope remains constant.

* * * * *